United States Patent [19]

Tokunaga et al.

[11] Patent Number: 4,692,643

[45] Date of Patent: Sep. 8, 1987

[54] SEMICONDUCTOR SWITCHING DEVICE HAVING PLURAL MOSFET'S, GTO'S OR THE LIKE CONNECTED IN SERIES

[75] Inventors: Norikazu Tokunaga; Hiroshi Fukui; Kouzou Watanabe; Hisao Amano; Masayoshi Sato, all of Hitachi, Japan

[73] Assignee: Hitachi, Ltd., Tokyo, Japan

[21] Appl. No.: 665,132

[22] Filed: Oct. 26, 1984

[30] Foreign Application Priority Data

| Oct. 28, 1983 | [JP] | Japan | 58-200892 |
| Nov. 2, 1983 | [JP] | Japan | 58-204696 |
| Feb. 17, 1984 | [JP] | Japan | 59-27106 |
| Feb. 22, 1984 | [JP] | Japan | 59-30243 |
| Apr. 25, 1984 | [JP] | Japan | 59-81834 |
| May 23, 1984 | [JP] | Japan | 59-102582 |

[51] Int. Cl.$^4$ .................. H03K 17/687; H03K 17/60
[52] U.S. Cl. .................. 307/584; 307/570; 307/575; 307/577
[58] Field of Search .......... 307/254, 252 C, 584, 307/570, 571, 585, 481, 575, 577, 242, 239, 304

[56] References Cited

U.S. PATENT DOCUMENTS

| 3,095,510 | 6/1963 | Lane | 307/254 |
| 3,202,904 | 8/1965 | Madland | 307/254 |
| 3,891,866 | 6/1975 | Okuhara et al. | 307/252 C |
| 4,394,590 | 7/1983 | Honda | 307/584 |

Primary Examiner—Stanley D. Miller
Assistant Examiner—Trong Q. Phan
Attorney, Agent, or Firm—Antonelli, Terry & Wands

[57] ABSTRACT

A semiconductor switching device includes a row of a plurality of switching elements connected in series. The input terminal of the input-nearest switching element and the output terminal of the output-nearest switching element are connected with the input terminal and output terminal of the semiconductor switching device, respectively. A control signal is applied to the control terminal of the output-nearest switching element. The semiconductor switching device comprises a first plurality of capacitive elements each of which is connected between the output terminal of the output-nearer switching element and the control terminal of the input-nearer switching element of the adjacent switching elements among the switching element row; and a second capacitive element connected between the output terminal and input terminal of the input-nearest switching element. At least the switching elements ($S_2$-$S_n$) have insulating gates, respectively.

26 Claims, 20 Drawing Figures

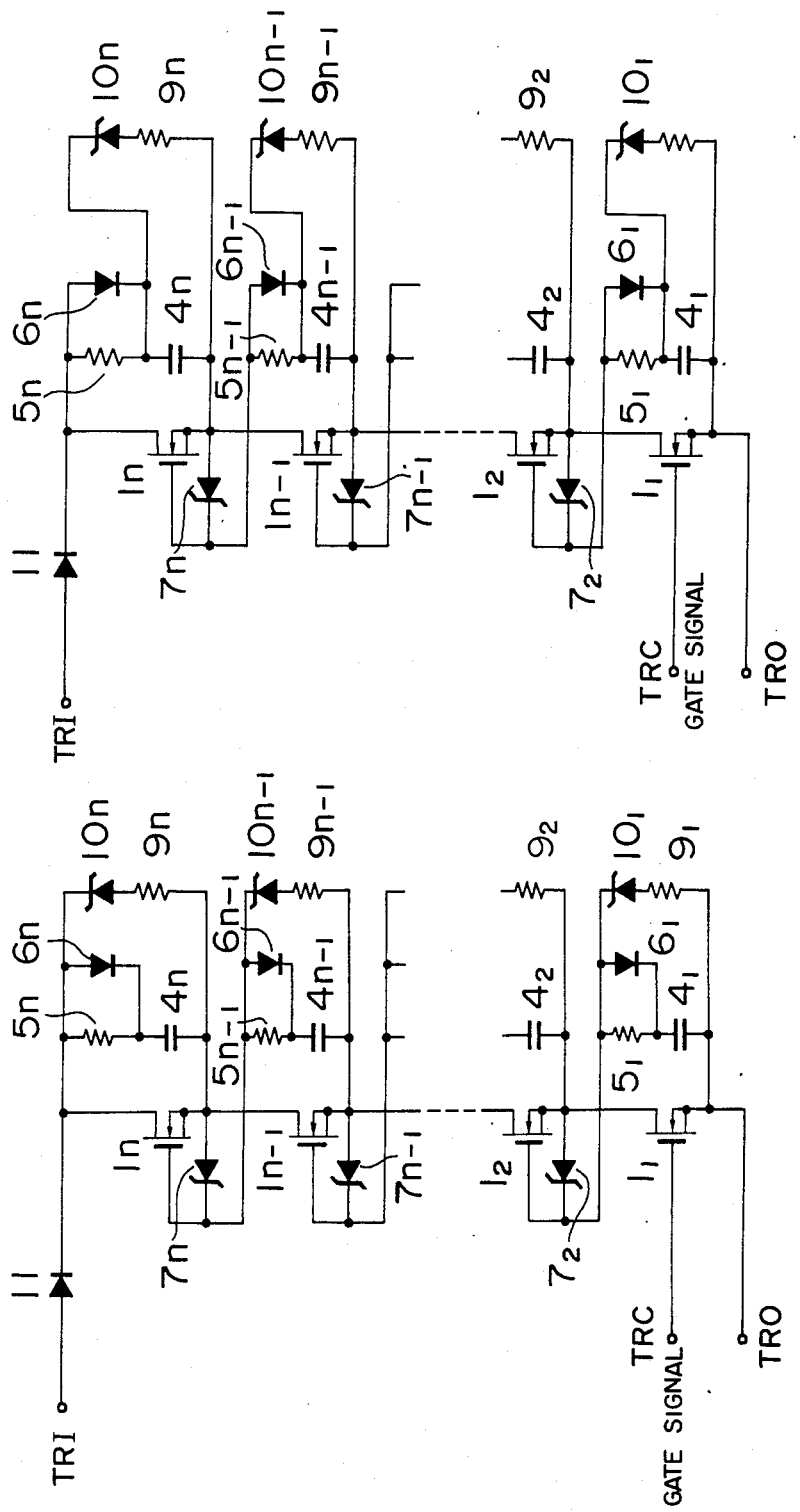

SEMICONDUCTOR SWITCHING DEVICE HAVING PLURAL MOSFET'S, GTO'S OR THE LIKE CONNECTED IN SERIES

This invention relates to a switching device using semiconductor elements, and more particularly to a switching device having plural MOSFET's (Metal Oxide Semiconductor Field Effect Transistor), GTO's (Gate Turn-Off Thyristor) or the like connected in series with another. The switching device according to this invention is preferably applicable to the switching of high voltage circuits such as medical X-ray production devices, electron beam welding devices, neutral particle incident devices for neclear fusion and semiconductor fabricating devices.

The development of a semiconductor element with high breakdown voltage has replaced, as a switch to be used in high voltage circuit, the conventional vacuum tube by a series circuit of semiconductor elements. A typical example of this is a power converter device having several hundred thyristors connected in series which implements a high voltage switch with a breakdown voltage of 250 kV and a current of 1.5 kA. However, since the thyristor does not have a function of turn-off, vacuum tubes are still utilized for the high voltage switching circuit requiring the cut-off function.

One example of a semiconductor element having the turn-off function is the a MOSFET. A MOSFET provides, because of being a voltage controlled type element, excellent characteristics such as small driving power, high breakdown strength due to the absence of current concentration and excellent switching characteristic due to the absence of storage effect of carriers. However, a MOSFET as a single body has only been implemented as a device with a breakdown voltage of about 1 kV at the most. Therefore, a series connection of plural MOSFET's is required for the realization of high breakdown voltage.

FIG. 2 shows a so-called totem pole type switching circuit having n MOSFET's connected in series such as disclosed in HITACHI APPLICATION NOTE (9F-55.04) pages 7-8. With no gate signal being applied to MOSFET $1_1$, it is turned off, thereby providing no current flowing therethrough. Then, MOSFET's $1_2$-$1_n$ connected in series are also turned off since they operate to follow MOSFET $1_1$. Thus, the voltages divided by resistors $2_1$-$2_n$ are applied to the respective gates of MOSFET's $1_2$-$1_n$ and the voltages nearly decided by the resistors $2_1$-$2_n$ are applied between the source and drain of each of MOSFET's $1_1$-$1_n$. On the other hand, with a gate signal being applied to MOSFET $1_1$, it starts to conduct, and MOSFET's $1_1$-$1_n$ also start to conduct as slaved to MOSFET $1_1$. As a result, the switching circuit becomes on.

Thus, the switching circuit as shown in FIG. 2 can be on-off controlled by the application or non-application of the gate signal to MOSFET 1. However, MOSFET's $1_2$-$1_n$ require, for their switching-on, the application of the respective voltages sufficient to maintain their conduction state between the gate and source of each of MOSFET's $1_2$-$1_n$. Therefore, the switching circuit of the mode as shown in FIG. 2 causes the increase of the so-called on-resistance which means the increase of the voltage held in the switching circuit in the conduction state, attributed to the excess increase of the drain potential of each of MOSFET's $1_2$-$1_n$ to the extent necessary to drive them. The on-resistance where only two MOSFET's are connected in series is increased twice so that the on-resistance where many MOSFET's are connected in series becomes extremely high. Thus, the increase of circuit loss in the switching circuit and the reduction of voltage to be applied to a load circuit, which are attributable to the increase of voltage drop in the conduction state, are very significant.

The other example of the semiconductor element having blocking function is a gate turn-off thyristor (GTO) the breakdown or withstand voltage of which approaches 4 kV. The most common example of the series connection of GTO's is shown in FIG. 3. This circuit can be implemented to the extent of 10 or so in the number of GTO's in series connection, but is not practicable in the case of being more in the above number since its circuit construction is complicated because of the driving circuit GA required for each GTO.

FIG. 4 shows a circuit construction of the so-called slave firing or ignition such as disclosed in "A 20 KVA DC SWITCH EMPLOYING SLAVE CONTROL OF SERIES OPERATED GATE CONTROLLED SWITCHES" by J. W. Motto. Jr., 1964 WESTERN ELECTRONIC SHOW AND CONVENTION/LOWANGELES, AUGUST 25-28. In this circuit, when $GTO3_1$ at the lowest stage in the series connection of GTO's turns on, capacitor $4_1$ starts to discharge through resistor $5_1$, the gate, cathode of $GTO3_2$ and the anode, cathode of $GTO3_1$. The discharging current from capacitor $4_1$ is an on-gate current for $GTO3_2$, switching $GTO3_2$ on. In the same manner, GTO's $3_3$, $3_4$ ... $3_n$ will sequentially turn on. On the other hand, when $GTO3_1$ turns off, the current having been flowing in the circuit flows through the gate of $GTO3_2$, diode $6_1$ and capacitor $4_1$. This current is an off-gate current for $GTO3_2$, switching $GTO3_2$ off. When $GTO3_2$ turns off, the current having been flowing in the circuit flows through the gate of $GTO3_3$, diode $6_2$, capacitor $4_2$, the cathode, gate of $GTO3_2$, diode $6_1$ and capacitor $4_1$. This current is an off-gate current for $GTO3_3$, switching $GTO3_3$ off. In the same manner, GTO's $3_4$, $3_5$ ... $3_n$ will turn off.

As described above, the slave firing circuit system requires a driving circuit 100 for on-off control of GTO's for only $GTO3_1$ at the lowest stage. The other GTO elements can be sequentially on-off controlled in accordance with the GTO element at the lowest stage. This circuit system can therefore obviate the complication of the driving circuit such as shown in FIG. 3.

However, this slave firing circuit system is disadvantageous in that where load current is so small as not to reach the holding current for GTO's, the GTO will turn off. The common GTO circuit maintains the GTO's in the conduction state by continuously applying the gate current to their GTO's during the on-period. On the other hand, the slave firing circuit system does not permit all of GTO's to be continuously supplied with the gate current during the on-period. The switching circuit of the slave firing mode as shown in FIG. 4 disadvantageously maintains the blocking state since the blocking of current occurs when the load current does not reach the holding current of the GTO's.

As described above, the switching circuits as shown in FIGS. 2 and 4 are disadvantageous in that steady on-off control cannot be made over a wide area from small current to large current.

An object of this invention is to provide a switching circuit which enables steady on-off control over a wide area from small current to large current.

As seen from FIG. 1, a switching circuit S is connected with a D.C. power supply Es and a load circuit L, and the construction of the switching circuit S according to this invention is shown in FIG. 5. As seen from FIG. 5, switching elements $S_1$, $S_2$ ... $S_n$ are in series connection in order so that the output terminal for load circuit current of the switching elements $S_n$, $S_{n-1}$, ..., $S_2$ is coupled with the input terminal for load circuit current of the switching elements $S_{n-1}$, $S_{n-2}$, ..., $S_1$, respectively. The input terminal of the switching element $S_n$ at the highest stage is connected with one end TRI of the switching circuit S while the output terminal of the switching element $S_1$ at the lowest stage is connected with the other end TRO of the switching circuit S. Capacitor elements $C_1$, $C_2$ ..., $C_{n-1}$ are sequentially connected so that the output terminal of the switching elements $S_1$, $S_2$, ..., $S_{n-1}$ is coupled with the control terminal of the switching elements $S_2$, $S_3$, ..., $S_n$, respectively through capacitor elements $C_1$, $C_2$, ..., $C_{n-1}$. The capacitor element $C_n$ at the highest stage is connected between the output terminal of the switching element $S_n$ and the input terminal thereof. The control terminal of the switching element $S_1$ at the lowest stage is constituted to be supplied with a control signal, while the respective control terminals of at least, the switching elements $S_2$, $S_3$, ..., $S_n$ constitute insulating gates.

In order to perform steady on-off control, it is necessary to apply and stop a sufficient voltage to the control terminals of the switching elements operating as slaves. To this end, this invention supplies a series of the switching elements $S_1$-$S_n$ with the capacitor elements $C_1$-$C_n$ each of which performs the application of driving energy to the corresponding switching element in the on-state, and the absorption of circuit energy and the discharge of the input capacitance of the control terminal of the corresponding switching element in the off-state, thereby operating the switching elements $S_2$-$S_n$ in the manner of slave control.

The above and other objects, features and advantages of this invention will be apparent from, the following detailed description of the preferred embodiments of the invention taken in conjunction with the accompanying drawings, in which:

FIGS. 6–12 show circuit diagrams of the switching circuits according to the respective embodiments of this invention, each of which is constituted by switching elements each of which including an MOSFET in series connection;

Figure 6:
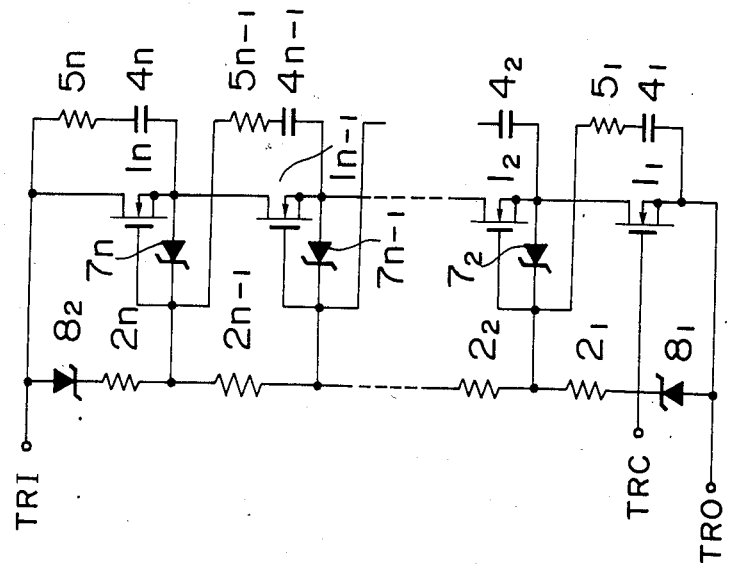

FIG. 6 shows one embodiment of this invention. As seen from the figure, plural MOSFET's are connected in series with another in order and a series circuit of each of capacitors $4_1$-$4_n$ and each of the corresponding resistors $5_1$-$5_n$ is connected between the source of MOSFET $1_1$, the conduction of which is controlled by the control signal applied to its gate, and the gate of MOSFET $1_2$; between the source of each of MOSFET's $1_2$-$1_{n-1}$ and the gate of each of MOSFET's $1_3$-$1_n$; and between the source and drain of MOSFET $1_n$ at the final stage among these MOSFET's. Each of Zener diodes $7_2$-$7_n$ is connected between the source and gate of each of MOSFET's $1_2$-$1_n$ sequentially connected in series with MOSFET $1_1$.

Figure 2:
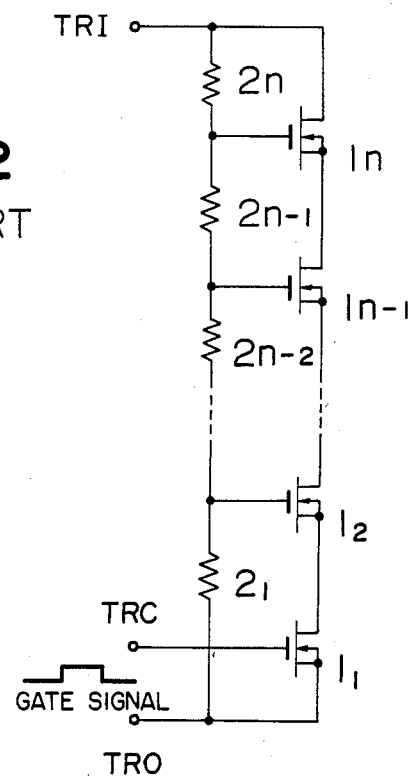
FIG. 2 shows the prior art switching circuit constituted by switching elements each of which including an MOSFET in series connection.
Figure 3:
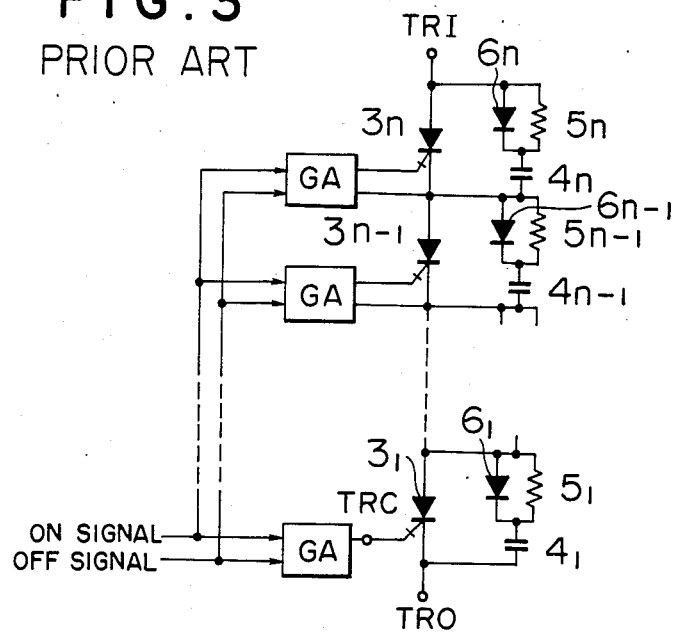
FIGS. 3 and 4 show the prior art switching circuit constituted by switching elements each of which includes a GTO in series connection.
Figure 4:
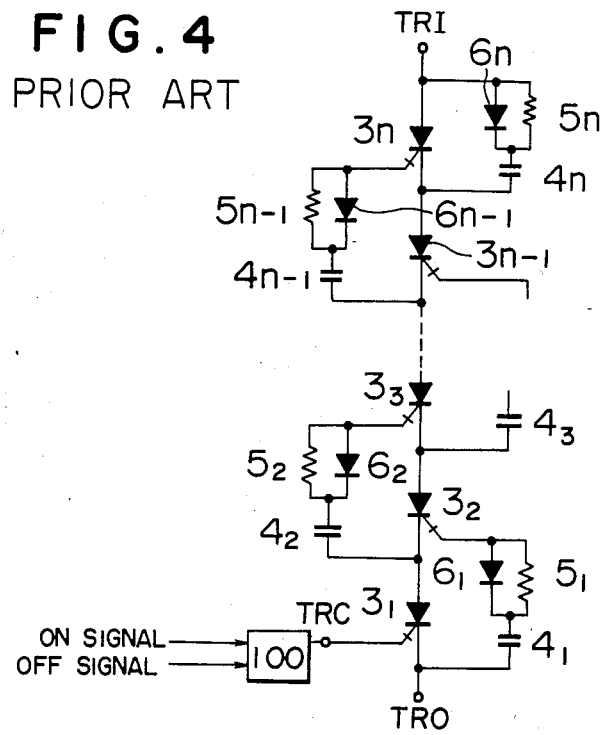
Figure 5:
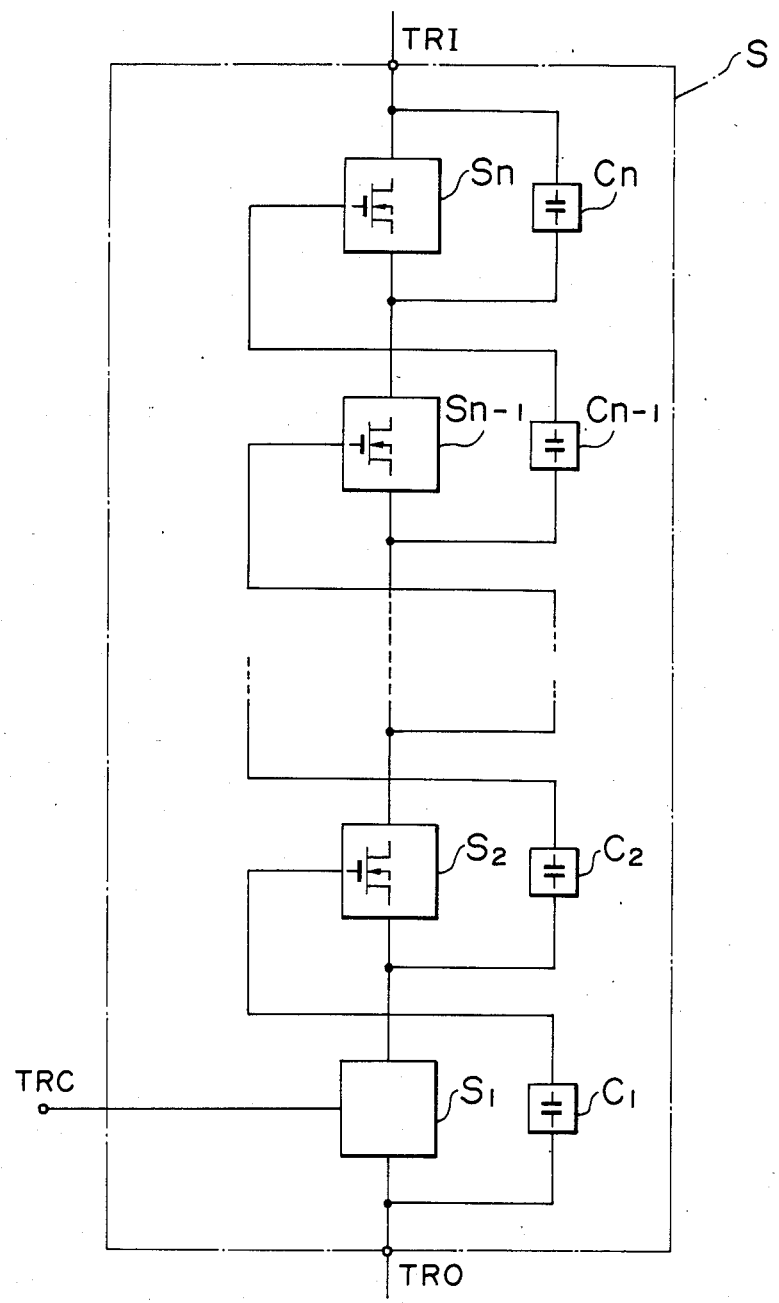
FIG. 5 shows a circuit construction of the switching circuit according to this invention.

The operation of the switching circuit according to this embodiment is as follows. When a positive gate signal is not applied to MOSFET $1_1$, it is in the blocking state, and so MOSFET's $1_2$-$1_n$ slaved to MOSFET $1_1$ are also in their blocking state. Then, the switching circuit is in the off-state and supplied with the voltage $E_x$ determined by the power supply circuit. Where the capacitors $4_1$-$4_n$ are substantially equal in their capacitance, the voltage $E_x$ is substantially equally shared thereby so that the respective voltages substantially corresponding to the capacitances of the capacitors $4_1$-$4_n$ are applied to MOSFET's $1_1$-$1_n$. Next, when the positive gate signal is applied to MOSFET $1_1$, it starts to conduct. Then, the capacitor $4_1$ starts to discharge through the resistor $5_1$, the gate, source of MOSFET $1_2$ and the drain, source of MOSFET $1_1$. Thus, the voltage sufficient to operate MOSFET $1_2$ is applied between the gate and source of MOSFET $1_2$, and so MOSFET $1_2$ starts to conduct. The Zener diode $7_2$ is provided for restraining the gate-source voltage of MOSFET $1_2$ below a predetermined value. MOSFET's $1_3$-$1_n$ sequentially start to conduct in the same manner. As a result, the switching circuit turns on. MOSFET $1_1$ maintains the on-state with a sufficiently low on-resistance since the positive gate signal is continuously applied to MOSFET $1_1$ during the on-period. MOSFET $1_2$ also maintains the on-state with a sufficiently low on-resistance, like MOSFET $1_1$, since the voltage determined by the Zener diode $7_2$ is continuously applied to the gate and source of MOSFET $1_2$ due to the absence of a discharge circuit. MOSFET's $1_3$-$1_n$ also maintain their on-state, like MOSFET $1_2$. Therefore, the switching circuit according to this embodiment permits the on-resistance thereof to be sufficiently reduced, with many switching elements being connected in series, unlike the circuit system as shown in FIG. 2 in which the drain-source voltage of each of MOSFET's is applied to the gate thereof.

When the application of the gate signal to MOSFET $1_1$ is stopped, it is switched into the blocking state, with no current flowing therethrough. Therefore, a load circuit current flows through the source, gate of MOSFET $1_2$, resistor $5_1$, and capacitor $4_1$, thereby discharging the charge supplied between the gate and source of MOSFET $1_2$ when it is in the on-state. Discharging between the gate and source of MOSFET $1_2$ switches MOSFET $1_2$ into the blocking state, with no current flowing therethrough. The load circuit current flows through the source, gate of MOSFET $1_3$, resistor $5_2$, capacitor $4_2$, Zener diode $7_2$, resistor $5_1$ and capacitor $4_1$, thereby making the discharging between the gate and source of MOSFET $1_3$. Thus, MOSFET $1_3$ turns off like MOSFET $1_2$. MOSFET's $1_4$, $1_5$ ... $1_n$ will sequentially turn off. As a result, the switching circuit will turn off.

An MOSFET is as short as several tens ns or less in its switching time, so that there does not almost ocur the unbalance among the shared voltages that is to be ascribed to the differences in switching times in the above turn-on and off operations. Further, the capacitors $4_1$–$4_n$ reduce the changing rate of the load circuit current at the time of switching-off, which prevents an excess voltage from being applied to the switching circuit.

Figure 7:
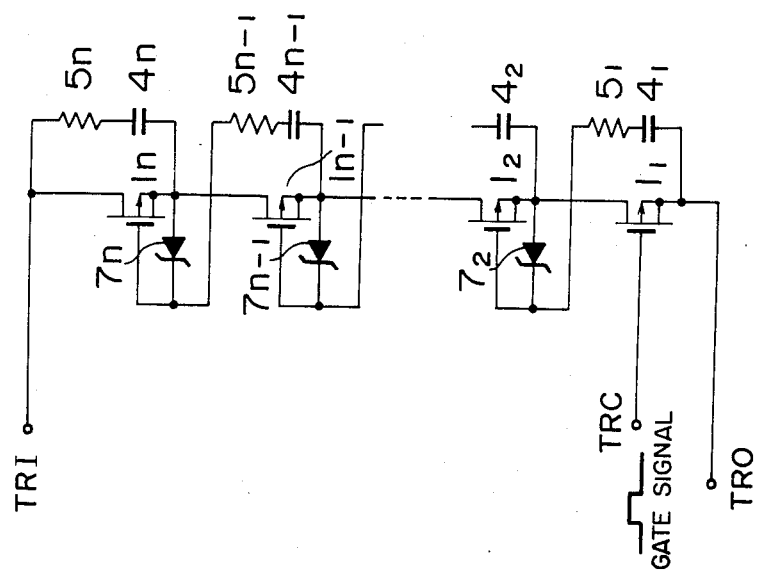

FIG. 7 shows another embodiment of the switching circuit of this invention. This is different from the embodiment of FIG. 6 in that the voltage dividing for MOSFET's $1_1$–$1_n$ is made by the circuit consisting of potentiometric resistors $2_1$–$2_n$ and Zener diodes $8_1$, $8_2$ connected between the power supply and the respective gates of MOSFET's $1_1$–$1_n$. The series circuits consisting of the resistor $2_1$ and the Zener diode $8_1$ and of the resistor $2_n$ and the Zener diode $8_2$ are connected between the gate of MOSFET $1_2$ and the source of MOSFET $1_1$ and between the drain and gate of MOSFET $1_n$, respectively, unlike between the respective gates of MOSFET's $1_2$–$1_n$. This intends to provide the voltage sufficient to drive MOSFET's $1_2$ and $1_n$, which may be impaired by the possible discharging of capacitors $4_1$ and $4_{n-1}$ during the on-state of the switching circuit. Incidentally, the Zener voltage of each of the Zener diodes $8_1$ and $8_2$ is nearly equal to or higher than that of each of the Zener diodes $7_2$ and $7_n$. This embodiment of the invention can, because of the presence of the potentiometric circuit using resistors, provide more steady operation, even with MOSFET's $1_1$–$1_n$ and the Zener diodes $7_2$–$7_n$ being unbalanced in their characteristic.

Figure 8:
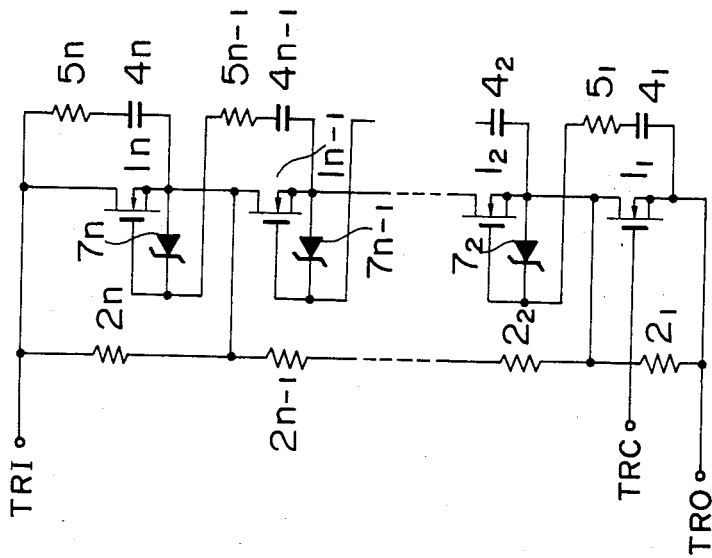

FIG. 8 shows another embodiment of the switching circuit of this invention. This is different in the embodiment of FIG. 7 in that each of potentiometric resistors $2_1$–$2_n$ are connected between the drain and source of each of MOSFET's $1_1$–$1_n$. This embodiment can provide steady operation, like the embodiment of FIG. 7, even with MOSFET's $1_1$–$1_n$ and the Zener diodes $7_2$–$7_n$ being unbalanced in their characteristic.

Figure 9:
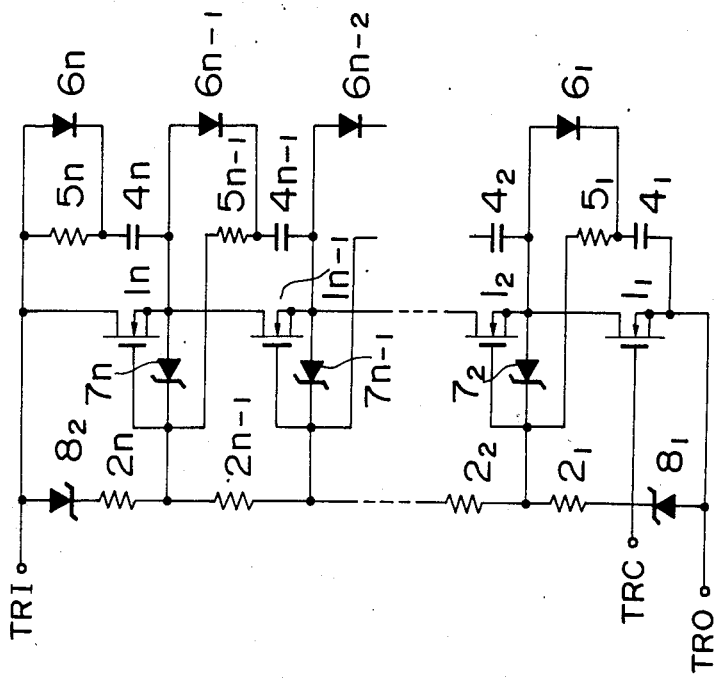

FIG. 9 shows a further embodiment of the switching circuit of this invention. This is different from the embodiment of FIG. 7 in the connections of diodes $6_1$–$6_n$. This embodiment can also prevent step voltages from being applied to the switching circuit while the switching circuit is in the off-state. These step voltage are supplied by the products of the load circuit current and the values of the resistors $5_1$–$5_n$. Incidentally, the embodiments of FIGS. 6 and 8 can also prevent the application of the step voltage while the switching circuit is in the off-state, by the connection of diodes in the same manner as in FIG. 9.

The Zener diodes $7_2$–$7_n$ and $8_1$, $8_2$ may be replaced by the other elements having the same function as the Zener diode.

FIG. 10 shows a further embodiment of the switching circuit of this invention. When a positive gate signal is not applied to MOSFET $1_1$, it is in the blocking state. Then, MOSFET's $1_2$–$1_n$ slaved to MOSFET $1_1$ are also in the blocking state. Thus, power supply voltage $E_s$ is applied to the entire switching circuit. The voltage to be applied between the drain and source of each of MOSFET's $1_1$–$1_n$ is almost determined by the values of resistors $9_1$–$9_n$, so that substantially equivalent voltages are applied thereto by setting the resistors $9_1$–$9_n$ to equal values. When the positive gate signal is applied to MOSFET $1_1$, it starts to conduct. Then, the capacitor $4_1$ starts to discharge through the resistor $5_1$, the gate, source of MOSFET $1_2$, and the drain, source of MOSFET $1_1$. Thus, the voltage sufficient to operate MOSFET $1_2$ is applied between the gate and source of MOSFET $1_2$, and so MOSFET $1_2$ starts to conduct. The Zener diode $7_2$ is provided for restraining the gate-source voltage of MOSFET $1_2$ below a predetermined value. MOSFET's $1_3$–$1_n$ sequentially start to conduct in the same manner. As a result, the switching circuit turns on. MOSFET $1_1$ maintains the on-state with a small voltage drop since the positive gate signal of sufficient value is continuously applied to MOSFET $1_1$ during the on-period. MOSFET $1_2$ also maintains the on-state witch a sufficient small voltage drop, like MOSFET $1_1$, since the voltage determined by the Zener diode $7_2$ or $10_1$ is continuously applied to the gate and source of MOSFET $1_2$. MOSFET's $1_3$–$1_n$ also maintain their on-state, like MOSFET $1_2$. Therefore, the switching circuit according to this embodiment permits the voltage drop thereof during the on-period to be restrained to a sufficiently low level, with many MOSFET's being connected in series.

When the application of the gate signal to MOSFET $1_1$ is stopped, it is switched into the blocking state, with no drain current flowing therethrough. Therefore, a load circuit current flows through the source, gate of MOSFET $1_2$, diode $6_1$ and capacitor $4_1$, thereby discharging the charge supplied between the gate and source of MOSFET $1_2$ when it is in the on-state. Incidentally, the absence of the diode $6_1$ allows the load circuit current to flow through the resistor $5_1$, so that a step voltage determined by the current and the resistance of the resistor $5_1$ is applied to MOSFET $1_1$. The diode $6_1$ is connected in parallel with the resistor $5_1$ to prevent the application of the step voltage. The diode $6_1$ can be removed where the step voltage is considered to be negligible. Discharging between the gate and source of MOSFET $1_2$ switches MOSFET $1_2$ into the blocking state, with no current flowing therethrough. The load circuit current flows the source, gate of MOSFET $1_3$, diode $6_2$, capacitor $4_2$, Zener diode $7_2$, diode $6_1$, and capacitor $4_1$, thereby making the discharging between the gate and source of MOSFET $1_3$. Thus, MOSFET $1_3$ turns off like MOSFET $1_2$. MOSFET's $1_4$, $1_5$ ... $1_n$ will sequentially turn off. As a result, the switching circuit will turn off.

An MOSFET is very short in its switching time, so that there does not almost occur the unbalance among the shared voltages that is to be ascribed to the difference in switching times in the above on and off operations. The circuits consisting of the resistors $9_1$–$9_n$ and Zener diodes $10_1$–$10_n$ are provided for making the shared voltages equivalent through the absorption of the unbalance among the shared voltages associated with the off-operation and of the voltage change due to the drift of the power supply voltage Es. Capacitor $4_1$ discharges through the resistor 51, Zener diode $10_1$ and resistor $9_1$. Capacitors $4_2$–$4_n$ also discharge in the same manner as the capacitor $4_1$. Thus, the switching circuit operates in such a way that the shared voltages are always determined by the values of the resistors $9_1$–$9_n$, maintaining its stabilized off-state. The Zener diodes $10_1$–$10_n$ are provided for preventing the discharging of the capacitors $4_1$–$4_n$ during the on-period of the switching circuit, and their breakdown voltage is set to the value equal to or greater than that of the Zener diodes $7_2$–$7_n$.

Figure 1:
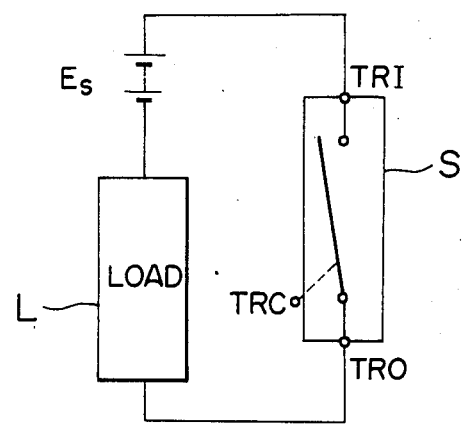
FIG. 1 shows a circuit arrangement in which a switching circuit is employed.

A diode 11 are provided for preventing the capacitors $4_1$–$4_n$ from discharging through the load L and power supply $E_s$ shown in FIG. 1 when the power supply voltage is reduced during the off-period of the switching circuit. The possible discharge currents act to charge the respective gate input capacitors of MOSFET's $1_2$–$1_n$ as in the above turn-on operation. Therefore, large drift of the power supply voltage causes the voltage across each of the gate input capacitors to be higher than a given cut-off voltage, which turns on MOSFET's $1_2$–$1_n$. However, actually, the presence of the diode 11 prevents the capacitors $4_1$–$4_n$ from discharging toward the power supply $E_s$. Thus, the capacitors $4_1$–$4_n$ discharge in such a way that the capacitor $4_1$, for example, discharges through the circuit consisting of the resistor $5_1$, Zener diode $10_1$, and resistor $9_1$, and don't perform the changing operation of the charge of each of the gate input capacitors of MOSFET's $1_2$–$1_n$. Therefore, even with the power supply voltage being abruptly reduced, the voltage across the gate input capacitor of each of MOSFET's $1_2$–$1_n$ is held below the cut-off voltage, and so the switching circuit does not perform any erroneous operation.

FIG. 11 shows a further embodiment of the switching circuit of this invention. This embodiment is different from the embodiment of FIG. 10 in that a series circuit of each of the Zener diodes $10_1$–$10_n$ and of each of the resistors $9_1$–$9_n$ is connected in parallel with each of the capacitors $4_1$–$4_n$. This embodiment also provides the same meritorious effect as the embodiment of FIG. 10. Incidentally, in the embodiments of FIGS. 10 and 11, the Zener diode $10_n$ connected at the highest stage may be removed.

Figure 12:
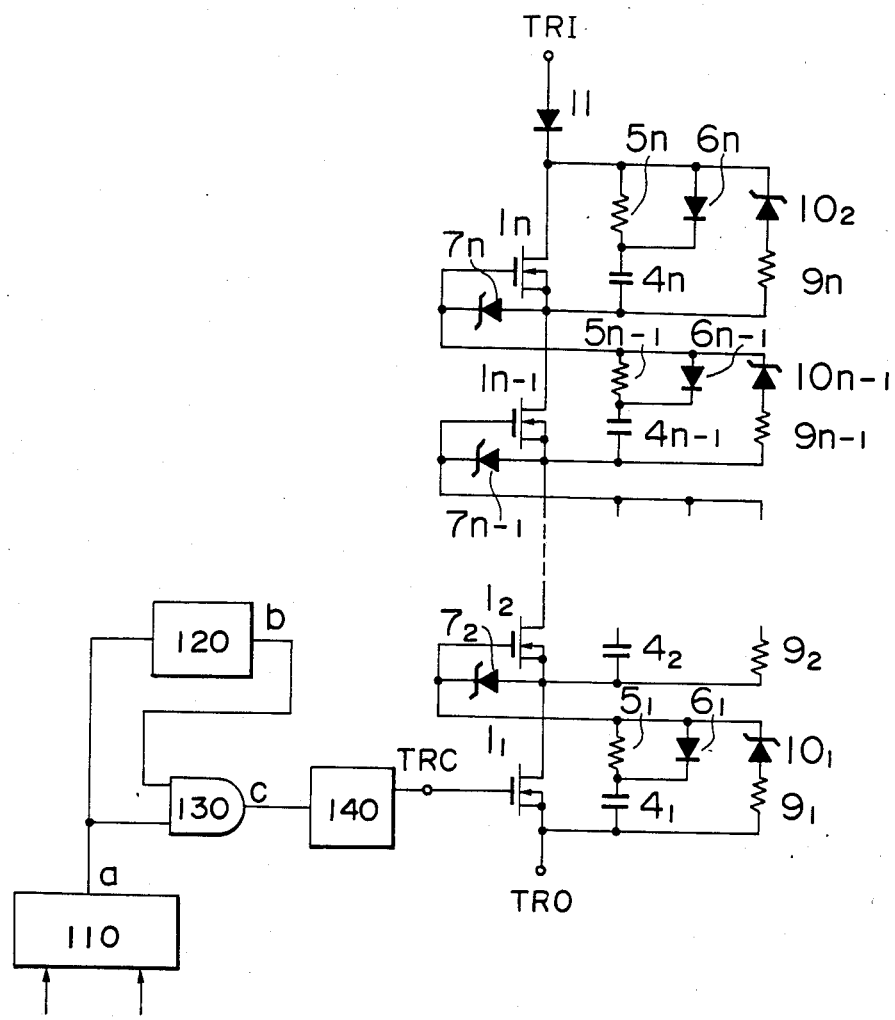

With the elapse of the on-period, the gatesource voltage of each of MOSFET's $1_2$–$1_n$ becomes reduced due to the loss of each of the capacitors $4_1$–$4_n$, the leak current of each of the Zener diodes $7_2$–$7_n$, $10_1$–$10_n$, etc. To suppress the reduction of the voltage, each of the capacitors $4_1$–$4_n$ is required to have a large capacitance. The large capacitance, however, is not preferable since it lengthens the blocking time of each MOSFET, and besides, the capacitance can only be increased to a certain extent. Thus, the elapse of the long on-period may cause the gate-source voltage of the MOSFET to be lower than the cut-off voltage thereof, thereby cancelling the maintainance of the on-state thereof. As a countermeasure, there is proposed an embodiment of FIG. 12 in which a periodical off-operation at narrow time widths is carried out to ensure driving energy so that the on-state can be maintained for a long on-period. In FIG. 12, a numeral 110 designates a flip-flop; 120 an oscillator activated by the rising edge of the output signal from the flip-flop 110, and for producing pulses for each certain period; 130 an AND circuit; and 140 a gate amplifier. The principal circuit of the switching circuit is common to FIG. 10. The operation of this embodiment will be explained below referring to FIG. 13. When an on-command is applied to the flip-flop 110, the output signal a from the flip-flop 110 becomes "1" level. The "1" level output signal therefrom is inputted to both the oscillator 120 and the AND circuit 130. The oscillator 120 is activated at the rising edge of the signal a and produces a pulse of a width of $T_2$ for each fixed period $T_1$. The AND circuit 130 creates a signal c which is a logical product of the signals a and b. The signal c drives MOSFET $1_1$ through the gate amplifier 140. MOSFET's $1_2$–$1_n$ perform an on-off operation, respectively, in accordance with the gate signal applied to MOSFET $1_1$. The blocking operation using pulses each width of which is $T_2$ intends to supplement the capacitors $4_1$–$4_n$ with charges.

Figure 13:
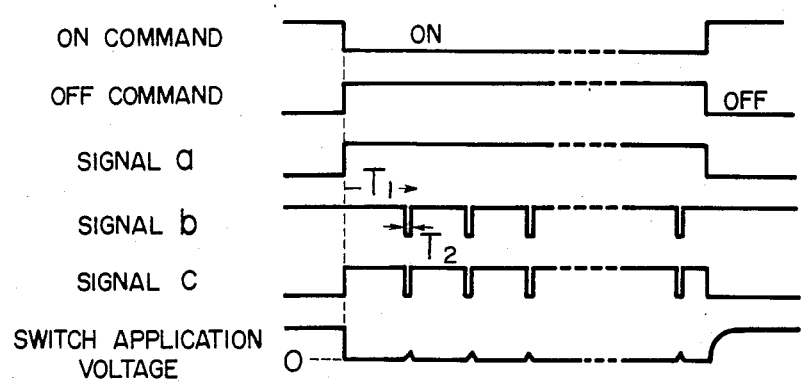
FIG. 13 shows an operation diagram of the respective embodiments of this invention.

When MOSFET's $1_1$–$1_n$ turn off, the capacitors $4_1$–$4_n$ start to charge with time constants decided by a load circuit resistor (not shown) and the capacitors $4_1$–$4_n$. The charging voltages may be values enough to ensure the driving of MOSFET's $1_2$–$1_n$ during the subsequent $T_1$ (The cut-off voltage of MOSFET is commonly several volts). Therefore, the voltage to be applied to the switching circuit increases to the voltage necessary to drive MOSFET's $1_2$–$1_n$ (value for lower than the power supply voltage) and thereafter returns to the value corresponding to the on-state of the switch circuit, as shown in FIG. 13. $T_2$ is determined considering the circuit constant and the charging voltage for driving MOSFET. The period $T_1$ can be extended since leaks of the Zener diodes $7_2$–$7_n$, $10_1$–$10_{n-1}$, capacitors $4_1$–$4_{n-1}$, etc. are commonly little. It is not necessary to suppress the reduction of voltage by the increase of capacitance so that the capacitance of the capacitor can be made small, and the off-period $T_2$ for assuring the driving energy can be made below several 10 $\mu s$'s. $T_2$ is negligible compared with $T_1$. The increase of the switch application voltage is low. Thus, the switching circuit operates in such a way that it can be regarded as maintaining the on-state during the application of the on-command.

This embodiment can be applied to not only the switching circuit using MOSFET's as semiconductor elements but also to the switching circuit using both MOSFET's and GTO's.

Figure 14:
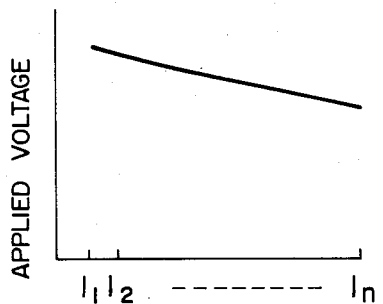
FIG. 14 shows a graph for explaining the relation among sharing voltages.

The switch application voltage while the switching circuit is in the off-state has such a characteristic as shown in FIG. 14, since the capacitor at a lower stage has more amount of charges stored at the time of turn-off and so shares a higher voltage until the substantially equal voltage sharing depending on the potentiometric resistors $9_1$–$9_n$ is accomplished. Such a tendency is more remarkable where the capacitors of smaller capacitances are adopted to shorten the blocking time of each MOSFET. Therefore, it is desired to make the equal voltage sharing by changing the capacitance of the potentiometric capacitor considering the amount of charges necessary to turn off each MOSFET.

In the case where the number of series connection of MOSFET's is n as shown in FIG. 10, when MOSFET $1_n$ turns off, the charge $Q_{m1}$ of the potentiometric capacitor $4_m$ of MOSFET $1_m$ ($1 \leq m \leq n$ is $$Q_{m1} = (n-m)Q_{off} \quad (1)$$

where $Q_{off}$ is the charge necessary to turn off each MOSFET. The values of the potentiometric resistors $9_1$–$9_n$ are so large that the discharging from the respective capacitors is negligible. The increments $Q_s$ of charges in the respective potentiometric capacitors $4_1$–$4_n$ after the turn-off of MOSFET $1_n$ are equal to each other, so that the charge $Q_{m2}$ of the resistor $4_m$ after the completion of the blocking of the switching circuit is $$Q_{m2} = Q_{m1} + Q_s \quad (2)$$

Therefore, the equal voltage sharing is made by selecting $C_m$ so that $$K = \frac{Q_{m2}}{C_m} = \text{constant} \quad (3)$$

For example, in the case of the load having a circuit inductance as small as negligible, with the power supply voltage of $E_s$, overcharging due to the circuit inductance does not occur, so that K is desired to be $$K = \frac{E_s}{n} \quad (4)$$

Therefore, at the n-th stage $$\frac{Q_s}{C} = \frac{E_s}{n} \quad (5)$$

$$Q_s = \frac{C_n}{n} E_s \quad (6)$$

$C_m$ at the m-th stage is obtained by the following equation:

$$\frac{1}{C_m}\left( (n-m)Q_{off} + \frac{C_n}{n} E_s \right) = \frac{E}{n} \quad (7)$$

$$C_m = C_n + \frac{n(n-m)}{E_s} Q_{off}$$

Figure 15:
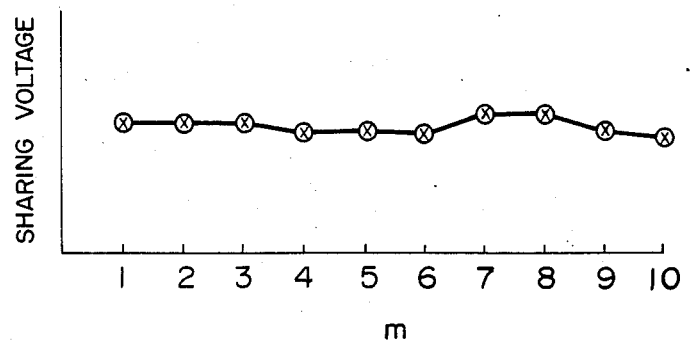
FIG. 15 shows a graph for explaining the improvement effect when potentiometric capacitance is changed.

Shown are in FIG. 15 the measured values of the sharing voltages in a semiconductor switching circuit in the case of the number n of switching elements in series connection being 10. It should be understood from this figure that the voltage sharing is remarkably improved by using potentiometric capacitors of the respective values close to those determined by equation (7). It is needless to say that the voltage sharing can be improved using GTO's instead of MOSFET's in like manner. Incidentally, in the case of GTO, it is necessary to define the respective values of potentiometric capacitors considering the extent of the switching circuit current to be used since the charge required for the turn-off thereof depends upon the switching circuit current.

Figure 16:
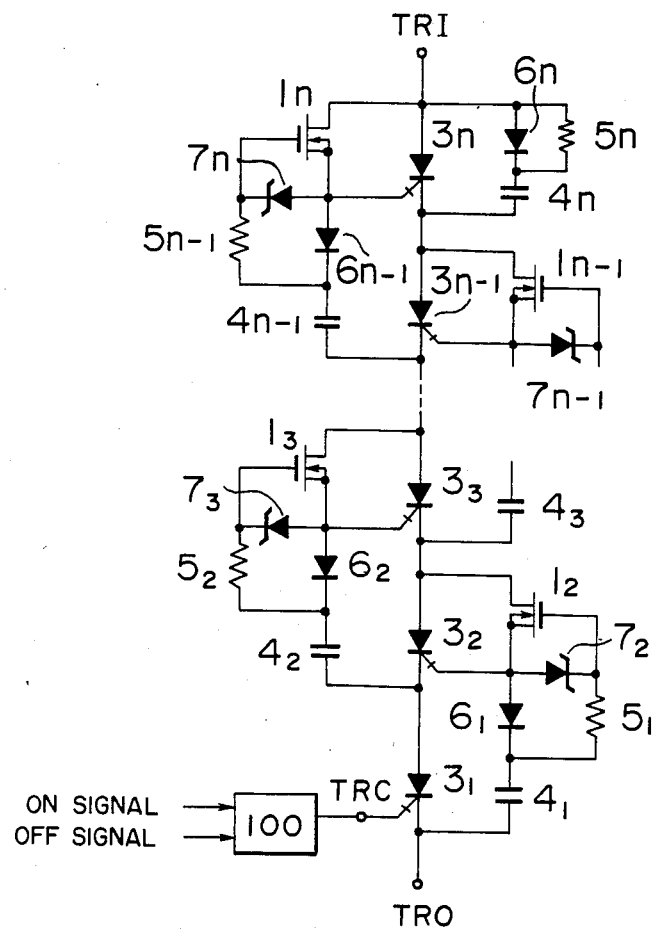
FIGS. 16 to 20 show circuit diagrams of the switching circuits according to the other embodiments of this invention each of which is constituted by switching elements each of which including a GTO and an MOSFET in series connection.

FIG. 16 shows a further embodiment of the switching circuit of this invention. The operation of this switching circuit is as follows. An on-signal is applied to a driving circuit 100 to apply an on-gate signal to $GTO3_1$. When $GTO3_1$ turns on, the capacitor $4_1$ discharges through the resistor $5_1$, the gate, source of MOSFET $1_2$, the gate, cathode of $GTO3_2$, and the anode, cathode of $GTO3_1$. A positive voltage is therefore applied between the gate and source of MOSFET $1_2$, and thus MOSFET $1_2$ turns on. Therefore, the sum of the current from MOSFET $1_2$ and the discharge current from the capacitor $4_1$ acts as a gate current to $GTO3_2$. Thus, $GTO3_2$ turns on. Incidentally, the gate-source voltage of MOSFET $1_2$ is limited to a specified value by the Zener diode $7_2$. In like manner, MOSFET $1_3$, $GTO3_3$, MOSFET $1_4$ and $GTO3_4$ sequentially turn on, thereby completing the turn-on operation of the switching circuit.

When the load circuit current is over the holding current of GTO's, the on-state of the switching circuit can be maintained by only GTO's until an off-signal is applied to the driving circuit 100 to apply an off-gate signal to $GTO3_1$. On the other hand, even when the load current is below the holding current of GTO's, GTO's $3_2$-$3_n$ maintain their on-state. This is because MOSFET's $1_2$-$1_n$ are in their on-state with the voltage applied between the gate and source of each thereof, so that the necessary gate current to each thereof flows through MOSFET's $1_2$-$1_n$ when GOT's $3_2$-$3_n$ start the shift to their off-state. Thus, the switching circuit of this invention can maintain the on-state thereof while the on signal is being applied to the driving circuit 100, regardless of the value of the load current.

Incidentally, the Zener diodes $7_2$-$7_n$ may be replaced by other switching elements provided that they can fix the voltage necessary to drive MOSFET's. Further, the Zener diodes $7_2$-$7_n$ can, of course, provide the same effect also in parallel connection with the diodes $6_1$-$6_{n-1}$. In this case, these diodes $6_1$-$6_{n-1}$ can be removed.

The turn-off of the switching circuit is carried out as follows. An off-signal is applied to the driving circuit 100 to apply an off-gate signal to $GTO3_1$. When $GTO3_1$ turns off, the load current flows through GTO's $3_n$, $3_{n-1}$, ... $3_3$, and the gate of GTO $3_2$, the diode $6_1$ and the capacitor $4_1$, and acts as the off-gate current to $GTO3_2$. Thus, $GTO3_2$ turns off. Then, discharging occurs between the gate and source of MOSFET $1_2$ and so the voltage therebetween becomes equal to the voltage drop across the diode $6_1$. Thus, MOSFET $1_2$ turns off. Next, the load current flows as the off gate current to $GTO3_3$ through the diode $6_2$, the capacitor $4_2$, the cathode, gate of $GTO3_2$, the diode $6_1$ and capacitor $4_1$, thereby switching off $GTO3_3$ and MOSFET $1_3$. In like manner, the 4th, 5th ... nth are switched into their off-state, thereby completing the turn-off operation of the switching circuit.

Figure 17:
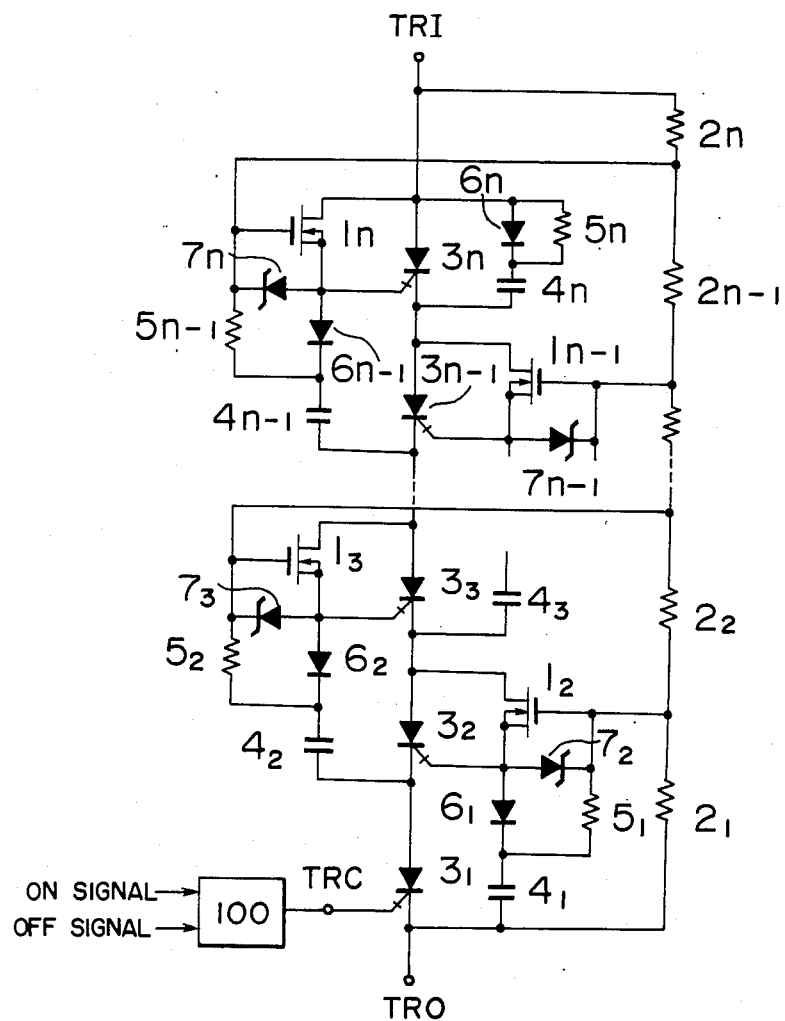

FIG. 17 shows a further embodiment of the switching circuit of this invention. This embodiment is different in that the potentiometric resistors $2_1$-$2_n$ are connected as shown. The on-off operation of the switching circuit is carried out in the same manner as the embodiment of FIG. 16.

Figure 18:
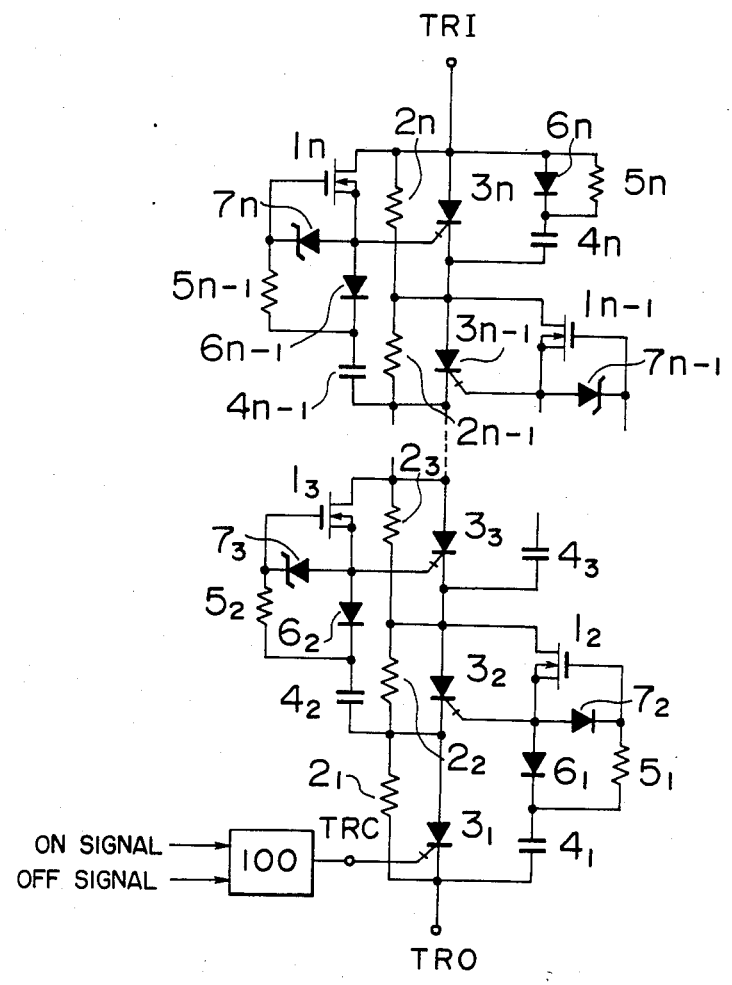

FIG. 18 shows a further embodiment of the switching circuit of this invention. This embodiment is different from the embodiment of FIG. 17 in that each of the potentiometric resistors $2_1$-$2_n$ are connected between the anode and cathode of each of GTO's $3_1$-$3_n$. The on-off operation of this switching circuit is the same as that of the embodiment of FIG. 16.

$GTO3_1$ at the lowest stage can, of course, be replaced by another switching element such as MOSFET.

Figure 19:
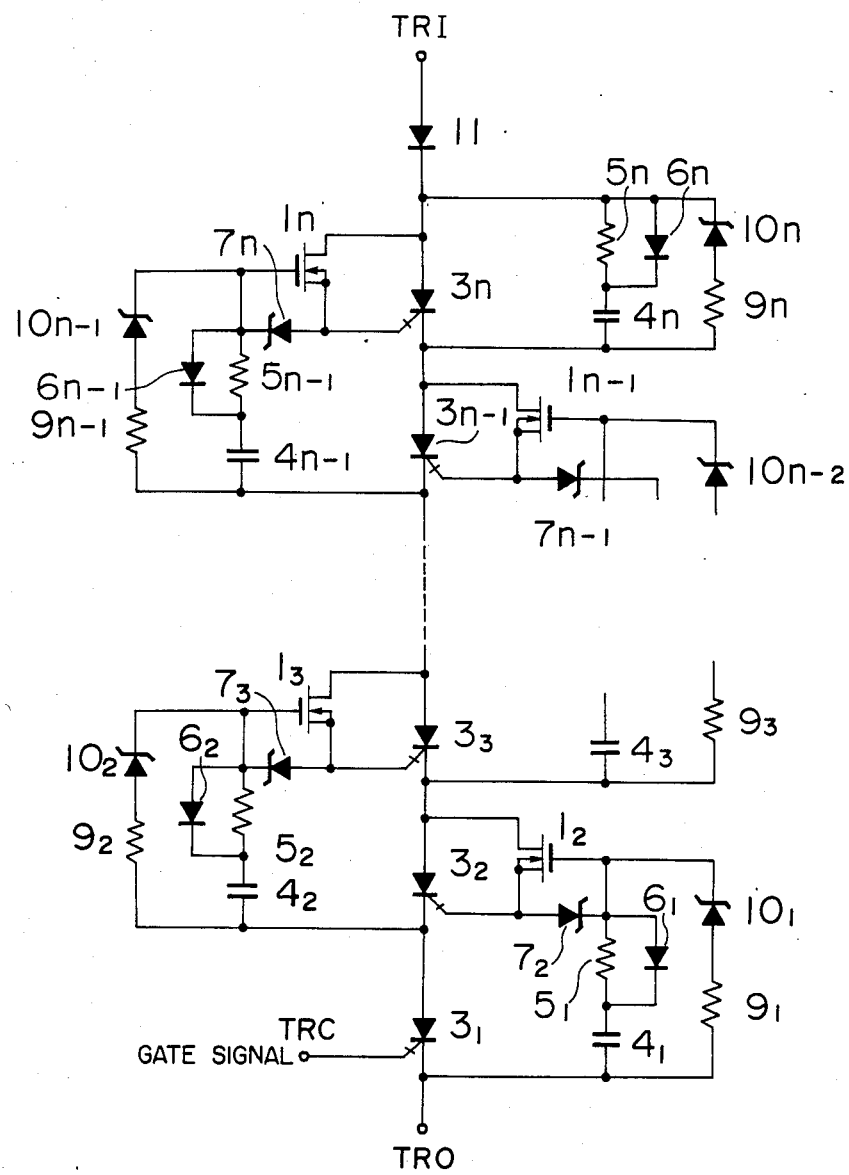

FIG. 19 shows a further embodiment of the switching circuit of this invehtion. The operation of this switching circuit will be explained below.

When $GTO3_1$ is in the off-state, GTO's $3_2$-$3_n$ are also in their off-state. Each of the capacitors $4_1$-$4_n$ lies charged to the voltage nearly determined by the potentiometric ratio of the resistors $9_1$-$9_n$. When an on-gate current is applied to $GTO3_1$, it turns on. When $GTO3_1$ turns on, the capacitor $4_1$ discharges through the resistor $5_1$, the gate, source of MOSFET $1_2$, the gate, cathode of $GTO3_2$, and the anode, cathode of $GTO3_1$. A positive voltage is therefore applied between the gate and source of MOSFET $1_2$, and thus MOSFET $1_2$ turns on. Therefore, the sum of the current from the drain of MOSFET $1_2$ and the discharge current from the drain of MOSFET $1_2$ and the discharge current from the capacitor $4_1$ acts as a gate current to $GTO3_2$, thereby turning on $GTO3_2$. Incidentally, the gate-source voltage of MOSFET $1_2$ is limited to a specified value by the Zener diode $7_2$. After the turn-on of MOSFET $1_2$ and $GTO3_2$, MOSFET $1_3$ and $GTO3_3$ also turn on, in like manner. MOSFET $1_4$, $GTO3_4$, ... MOSFET $1_n$, GTO$3_n$ sequentially turn on, thereby completing the turn-on operation of the switching circuit. Zener diodes $10_1$–$10_n$ are provided for preventing the reduction of the charges of the capacitors $4_1$–$4_{n-1}$ and of the charge supplied between the gate and source of each of MOSFET's $1_2$–$1_n$ in order to maintain the on-state of each of MOSFET's $1_2$–$1_n$ while the on-gate signal is being applied to GTO$3_1$. The switching circuit of this embodiment can maintain the on-state even with a load current being lower than the holding current of GTO, since MOSFET's are in their on-state while the on-gate signal is being applied to GTO$3_1$.

The turn-off of the switching circuit can be carried out in the following manner. An off-gate signal is applied to GTO$3_1$ to switch it into the off-state. When GTO$3_1$ turns off, the load current flows through GTO's $3_n$, $3_{n-1}$, ... $3_3$, and the gate of GTO$3_2$, the source, gate of MOSFET $1_2$, the diode $6_1$ and the capacitor $4_1$, and acts as the off-gate current to GTO$3_2$. The load current discharges the charges stored between the gate and source of MOSFET $1_2$, thereby switching MOSFET $1_2$ into the off-state. When the product of the off-gate current and time, i.e., charge reaches the value specified by element property, circuit condition, etc., GTO$3_2$ turns off. Incidentally, when the source-gate voltage of MOSFET $1_2$ reaches the voltage drop across the Zener diode $7_2$, the load current flows only the Zener diode $7_2$. Subsequently, the load current acts as the off-gate current to GTO$3_3$, thereby switching MOSFET $1_3$ and GTO$3_3$ into their off-state in the same manner as MOSFET $1_2$ and GTO$3_2$. Thus, the 4th, 5th, ... nth stages sequentially turn off, thereby completing the turn-off operation of the switching circuit.

A series circuit of each of the potentiometric resistors $9_1$–$9_n$ and each of the Zener diodes $10_1$–$10_n$ may be connected in parallel with each of the capacitors $4_1$–$4_n$. GTO$3_1$ at the lowest stage can, of course, be replaced by another switching element such as MOSFET. The Zener diode $10_n$ connected in series with the potentiometric resistor $9_n$ at the highest stage can be removed. The diode 11, as in the embodiments of FIGS. 10 and 11, is provided for preventing the capacitors $4_1$–$4_n$ from discharging through the load L and the power supply $E_s$ shown in FIG. 1.

Figure 20:
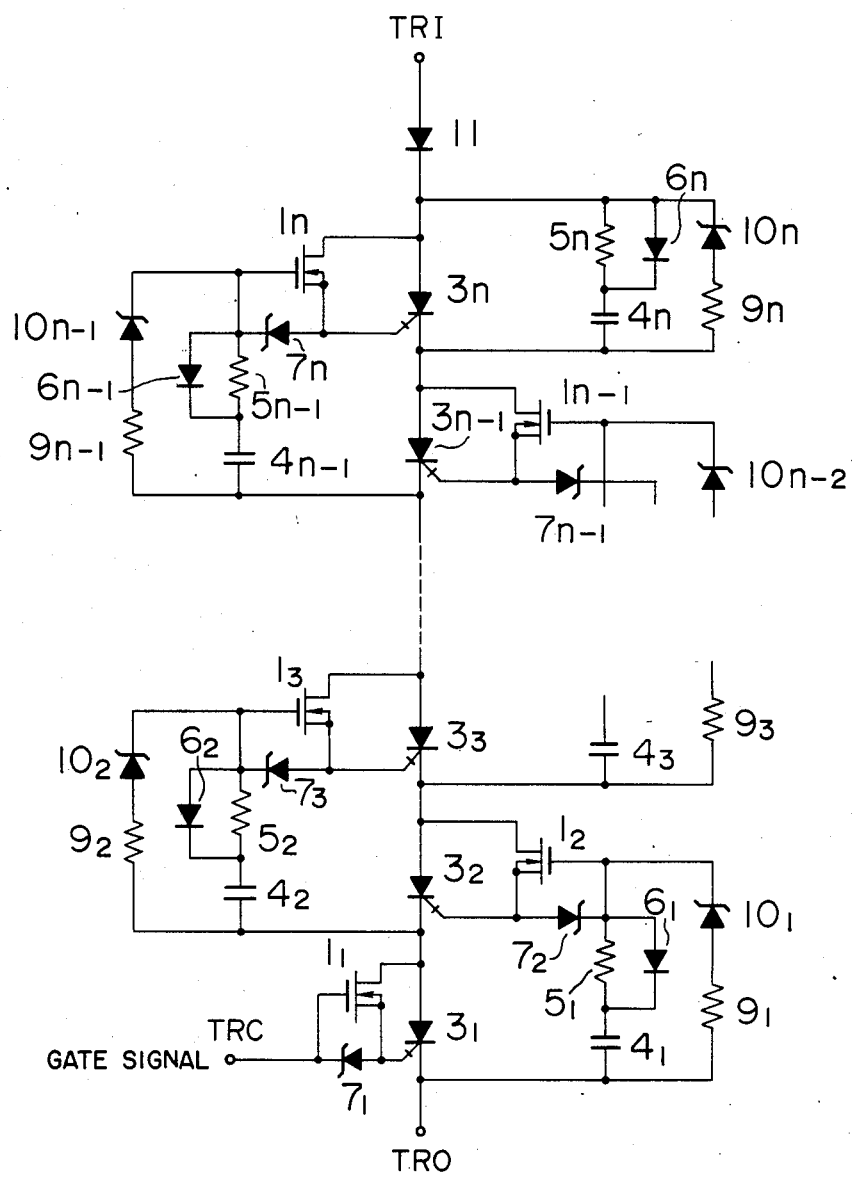

FIG. 20 shows another embodiment of the invention. This embodiment is different from that of FIG. 19 in that MOSFET $1$, and Zener diode $7_1$ are connected with GTO$3_1$ as shown in FIG. 20. When the positive gate signal is applied to MOSFET $1_1$, it starts to conduct. Then, the capacitor $4_1$ starts to discharge through the resistor $5_1$, the gate, source of MOSFET $1_2$, the gate, cathode of GTO$3_2$, the drain, source of MOSFET $1_1$, and the gate, cathode of GTO$3_1$. Thus GTO$3_1$ starts to conduct. When the negatige gate signal is applied to MOSFET $1_1$, MOSFET $1_1$ and GTO$3_3$ are turned-off. The operations other than the above are performed in the same way as the previous embodiment in FIG. 19.

We claim:

1. A semiconductor switching device including a row of a plurality of switching elements ($S_l$–$S_n$) connected in series between an input and an output terminal of said semiconductor switching device, an input terminal of the input-nearest switching element $S_n$ and an output terminal of the output-nearest switching element $S_l$ among said row being connected with said input terminal and said output terminal of said semiconductor switching device, respectively, and a control signal being applied to a control terminal of the output-nearest switching element, wherein said semiconductor switching device comprises a first plurality of capacitive elements each of which is connected between the output terminal of the output-nearer switching element and the control terminal of the input-nearer switching element of the adjacent switching elements among the switching element row, and a second capacitive element connected between the output terminal and input terminal of said input-nearest switching element, said switching elements ($S_2$–$S_n$) having insulating gates, respectively, wherein a constant voltage element is connected between a control terminal and one of the inpt and output terminals of at least each of said switching elements other than the output-nearest one, each said constant voltage element being arranged so that it will be in series with said first and second capacitive elements when said switching elements are turned-off.

2. A semiconductor switching device according to claim 1, wherein said plurality of switching elements ($S_2$–$S_n$) include MOSFET'S.

3. A semiconductor switching device according to claim 2, wherein each constant voltage element is connected between a control gate and an electrode of said MOSFET included in each of said switching elements.

4. A semiconductor switching device according to claim 2, wherein said first and second capacitive elements are connected in series with resistors, respectively.

5. A semiconductor switching device according to claim 4, wherein rectifying elements are connected between the respective connection points of said first capacitive elements and said resistors, and the respective sources of the MOSFET's adjacent to the respective series connections of said first capacitive element and said resistors; and between the connection point of said second capacitive element and said corresponding resistor and the input terminal of said input-nearest switching element, respectively.

6. A semiconductor switching device according to claim 1, wherein said first and second capacitive elements are connected in series with resistors.

7. A semiconductor switching device according to claim 6, wherein rectifying elements are connected in parallel with said resistors respectively and in the forward direction during said off-period of the semiconductor switching device.

8. A semiconductor switching device according to claim 1, wherein a rectifying element is connected in forward direction between the input terminal of said input-nearest switching element and the input terminal of said semiconductor switching device.

9. A semiconductor switching device according to claim 1, further comprising a series connection of voltage-dividing elements provided correspondingly to the respective switching elements and each connected between the input and output terminals of the associated switching element.

10. A semiconductor switching device including a row of a plurality of switching elements ($S_l$–$S_n$) connected in series between an input and an output terminal of said semiconductor switching device, an input terminal of the input-nearest switching element ($S_n$) and an output terminal of the output-nearest switching element ($S_1$) among said row being connected with said input terminal and said output terminal of said semiconductor switching device, respectively, and a control signal being applied to a control terminal of the output-nearest switching element, wherein said semiconductor switching device comprises a first plurality of capacitive elements each of which is connected between the output terminal of the output-nearer switching element and the control terminal of the input-nearer switching element of the adjacent switching elements among the switching element row, and a second capacitive element connected between the output terminal and input terminal of said input-nearest switching element, at least said switching elements ($S_2$–$S_n$) having insulating gates, respectively, wherein said first and second capacitive elements are connected in series with resistors, and wherein the device includes further resistors, connected in series with respective constant voltage elements, with the series connection of each of said first and second capacitive elements with said resistors being in parallel with the series connection of said further resistors and respective constant voltage elements.

11. A semiconductor switching device including a row of a plurality of switching elements ($S_1$–$S_n$) connected in series between an input and an output terminal of said semiconductor switching device, an input terminal of the input-nearest switching element ($S_n$) and an output terminal of the output-nearest switching element ($S_1$) among said row being connected with said input terminal and said output terminal of said semiconductor switching device, respectively, and a control signal being applied to a control terminal of the output-nearest switching element, wherein said semiconductor switching device comprises a first plurality of capacitive elements each of which is connected between the output terminal of the output-nearest switching element and the control terminal of the input-nearer switching element of the adjacent switching elements among the switching element row, and a second capacitive element connected between the output terminal and input terminal of said input-nearest switching element, at least said switching elements ($S_2$–$S_n$) having insulating gates, respectively, wherein said first and second capacitive elements are connected in series with resistors, and wherein the switching device includes further resistors, connected in series with respective constant voltage elements, with said first and second capacitive elements being connected in parallel with the series connection of the further resistors and respective constant voltage elements.

12. A semiconductor switching device including a row of a plurality of switching elements ($S_1$–$S_n$) connected in series between an input and an output terminal of said semiconductor switching device, an input terminal of the input-nearest switching element ($S_n$) and an output terminal of the output-nearest switching element ($S_1$) among said row being connected with said input terminal and said output terminal of said semiconductor switching device, respectively, and a control signal being applied to a control terminal of said output-nearest switching element, wherein said semiconductor switching device comprises:

MOSFET's included in at least said switching elements ($S_2$–$S_n$), respectively;

a first plurality of series connections each of which includes a capacitive element and a resistor, each connected between the output terminal of the output-nearer switching element and the control terminal of the input-nearer switching element of the adjacent switching elements among said switching element row;

a second series connection of a capacitive element and a resistor connected between the input terminal and the output terminal of said input-nearest switching element;

a rectifying element connected in forward direction between the input terminal of said input-nearest switching element and the input terminal of said semiconductor switching device;

constant voltage elements connected between the respective gates and respective sources of said MOSFET's;

rectifying elements connected in parallel with said resistors, respectively and in the forward direction during the off-period of said semiconductor switching device; and series connections each of which includes each of said resistors and each of said constant voltage elements, connected in parallel with said first and second series connections.

13. A semiconductor switching device according to claim 12, wherein each said constant voltage element is arranged so that it will be in series with said first and second series connections when said switching elements are turned-off.

14. A semiconductor switching device according to claim 12, further comprising a plurality of third series connections coupled respectively in parallel with said plurality of first series connection, each of said third series connections including a resistor and a constant voltage element and a fourth series connection coupled in parallel with said second series connection and including a resistor and a constant-voltage element.

15. A semiconductor switching device including a row of a plurality of switching elements connected in series between an input and an output terminal of said semiconductor switching device, an input terminal of the input-nearest switching element and an output terminal of the output-nearest switching element among said row being connected with said input terminal and said output terminal of said semiconductor switching device, respectively, and a control signal being applied to a control terminal of the output-nearest switching element, wherein said semiconductor switching device comprises:

a first plurality of series connections each of which includes a capacitive element and a resistor, each connected between the output terminal of the output-nearer switching element and the control terminal of the input-nearer switching element of the adjacent switching elements among said switching element row;

each of at least said switching elements other than the output-nearest one including a MOSFET having two electrodes defining a current path thereof and a control gate which acts as the control terminal of that switching element and a GTO having an anode and a gate connected, respectively, to the electrodes of said MOSFET;

a second series connection of a capacitive element and a resistor connected between the input terminal and the output terminal of said input-nearest switching element;

a rectifying element connected in forward direction between the input terminal of said input-nearest switching element and the input terminal of said semiconductor switching device;

constant voltage elements connected between the respective gates and respective sources of said MOSFET's;

rectifying elements connected in parallel with said resistors, respectively and in the forward direction during the off-period of said semiconductor switching device; and series connections each of which includes each of said resistors and each of said constant voltage elements, connected in parallel with said first and second series connections.

16. A semiconductor switching device according to claim 15, wherein each said constant voltage element is arranged so that it will be in series with said first and second series connections when said switching elements are turned-off.

17. A semiconductor switching device according to claim 15, further comprising a plurality of third series connections coupled respectively in parallel with said plurality of first series connection, each of said third series connections including a resistor and a constant voltage element and a fourth series connection coupled in parallel with said second series connection and including a resistor and a constant voltage element.

18. A semiconductor switching device including a row of a plurality of switching elements $S_1$-$S_n$ connected in series between an input and an output terminal of said semiconductor switching device, an input terminal of the input-nearest switching element ($S_n$) and an output terminal of the output-nearest switching element ($S_1$) among said row being connected with said input terminal and said output terminal of said semiconductor switching device, respectively, and a control signal being applied to a control terminal of the output-nearest switching element, wherein, said semiconductor switching device comprises a first plurality of capacitive elements each of which is connected between the output terminal of the output-nearer switching element and the control terminal of the input-nearer switching element of the adjacent switching elements among the switching element row, and a second capacitive element connected between the output terminal and input terminal of said input-nearest switching element, said switching elements ($S_2$-$S_n$) having insulating gates, respectively, wherein each of said switching elements other than the output-nearest one includes a MOSFET having two electrodes defining a current path thereof and a control gate which acts as the control terminal of that switching element and a GTO having an anode and a gate connected, respectively, to the electrodes of the MOSFET.

19. A semiconductor switching device according to claim 18, wherein a constant voltage element is connected between a control gate and an electrode of said MOSFET included in each of the switching elements.

20. A semiconductor switching device according to claim 18, wherein each of said first capacitive elements and said second capacitive elements is connected in series with a resistor.

21. A semiconductor switching device according to claim 20, wherein rectifying elements are connected between the respective connection points of said first capacitive elements and said resistors, and the respective sources of the MOSFET's adjacent to the respective series connections of said first capacitive elements and said resistors; and between the connection point of said second capacitive element and said corresponding resistor, and the input terminal of said input-nearest switching element, respectively.

22. A semiconductor switching device according to claim 21, wherein said rectifying elements are Zener diodes, respectively.

23. A semiconductor switching device according to claim 20, wherein constant voltage elements are connected in parallel with said rectifying elements, respectively.

24. A semiconductor switching device including a row of a plurality of switching elements $S_1$-$S_n$ connected in series between an input and an output terminal of said semiconductor switching device, an input terminal of the input-nearest switching element ($S_n$) and an output terminal of the output-nearest switching element ($S_1$) among said row being connected with said input terminal and said output terminal of said semiconductor switching device, respectively, and a control signal being applied to a control terminal of the output-nearest switching element, wherein said semiconductor switching device comprises a first plurality of capacitive elements each of which is connected between the output terminal of the output-nearer switching element and the control terminal of the input-nearer switching element of the adjacent switching elements among the switching element row, and a second capacitive element connected between the output terminal and input terminal of said input-nearest switching element, said switching elements ($S_2$-$S_n$) having insulating gates, respectively, further comprising means for producing said control signal which is variable between two levels and applied to the control terminal of said output-nearest switching element thereby defining its ON-period when said control signal is at one of the two levels and means for periodically changing said control signal of the one level to the other level for a short period of time.

25. A semiconductor switching device including a row of a plurality of switching elements $S_1$-$S_n$ connected in series between an input and an output terminal of said semiconductor switching device, an input terminal of the input-nearest switching element ($S_n$) and an output terminal of the output-nearest switching element ($S_1$) among said row being connected with said input terminal and said output terminal of said semiconductor switching device, respectively, and a control signal being applied to a control terminal of the output-nearest switching element, wherein said semiconductor switching device comprises a first plurality of capacitive elements each of which is connected between the output terminal of the output-nearer switching element and the control terminal of the input-nearer switching element of the adjacent switching elements among the switching element row, and a second capacitive element connected between the output terminal and input terminal of said input-nearest switching element, at least said switching elements ($S_2$-$S_n$) having insulating gates, respectively, further comprising a series connection of voltage-dividing elements provided correspondingly to the respective switching elements other than said output-nearest one, and having opposite terminals of said series connection connected to the input and output terminals, respectively, of said switching device, while respective junctions of said voltage dividing elements are connected respectively to the control terminals of said switching elements other than said output-nearest one.

26. A semiconductor switching device according to claim 25, wherein said opposite terminals of said series connection are connected through respective constant-voltage elements to the input and output terminals of said switching device.

* * * * *